United States Patent
Poiesz et al.

(10) Patent No.: US 11,269,259 B2
(45) Date of Patent: Mar. 8, 2022

(54) LITHOGRAPHIC APPARATUS AND A DEVICE MANUFACTURING METHOD

(71) Applicant: ASML NETHERLANDS B.V., Veldhoven (NL)

(72) Inventors: Thomas Poiesz, Veldhoven (NL); Bert Dirk Scholten, Best (NL); Dirk Willem Harberts, Eindhoven (NL); Lucas Henricus Johannes Stevens, Eindhoven (NL); Laura Maria Fernandez Diaz, Eindhoven (NL); Johannes Adrianus Cornelis Maria Pijnenburg, Moergestel (NL); Abraham Alexander Soethoudt, Eindhoven (NL); Wilhelmus Jacobus Johannes Welters, Weert (NL); Jimmy Matheus Wilhelmus Van De Winkel, Kessel (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 16/952,371

(22) Filed: Nov. 19, 2020

(65) Prior Publication Data

US 2021/0072649 A1  Mar. 11, 2021

Related U.S. Application Data (63) Continuation of application No. 16/690,198, filed on Nov. 21, 2019, now Pat. No. 10,871,715.

(30) Foreign Application Priority Data

Dec. 6, 2018  (EP) .................................... 18210662

(51) Int. Cl.
*G03F 7/20* (2006.01)

(52) U.S. Cl.
CPC ............................... *G03F 7/70341* (2013.01)

(58) Field of Classification Search
CPC .. G03F 7/70341; G03F 7/707; G03F 7/70716; G03F 7/70258; G03F 7/70486; G03F 7/70733; G03F 7/70991; G01N 15/1031
See application file for complete search history.

(56) References Cited

U.S. PATENT DOCUMENTS

| 6,952,253 B2 | 10/2005 | Lof et al. |
| 10,056,273 B2 | 8/2018 | Sasaki et al. |
| 2005/0041225 A1 | 2/2005 | Sengers et al. |

(Continued)

FOREIGN PATENT DOCUMENTS

| WO | 2018166738 | 9/2018 |
| WO | 2019001931 | 1/2019 |

*Primary Examiner* — Peter B Kim
(74) *Attorney, Agent, or Firm* — Pillsbury Winthrop Shaw Pittman, LLP (57) ABSTRACT

A substrate table for an immersion system having a projection system arranged to project an image onto a substrate and a liquid confinement system configured to confine an immersion liquid to a space between the projection system and the substrate, the substrate table including: a substrate holder configured to hold a substrate; and a current control device arranged to reduce an electric current flowing between the substrate and the substrate holder while the immersion liquid is confined to the space.

19 Claims, 7 Drawing Sheets

(56) References Cited

U.S. PATENT DOCUMENTS

| | | |
|---|---|---|
| 2006/0109447 A1 | 5/2006 | Moest et al. |
| 2007/0004234 A1* | 1/2007 | Goodwin .............. G03F 7/2041 438/800 |
| 2009/0297990 A1 | 12/2009 | Ono et al. |
| 2013/0016329 A1 | 1/2013 | Tanimoto |

* cited by examiner

LITHOGRAPHIC APPARATUS AND A DEVICE MANUFACTURING METHOD

This application is a continuation of U.S. patent application Ser. No. 16/690,198, filed Nov. 21, 2019, which claims the benefit of priority of European Patent Application No. 18210662.5, filed Dec. 6, 2018, each of the foregoing applications is incorporated herein in its entirety by reference.

FIELD

The present description relates to a lithographic apparatus, in particular of the immersion type and a device manufacturing method using the lithographic apparatus.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

As semiconductor manufacturing processes continue to advance, the dimensions of circuit elements have continually been reduced while the amount of functional elements, such as transistors, per device has been steadily increasing over decades, following a trend commonly referred to as "Moore's law". To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm.

In an immersion lithographic apparatus an immersion liquid is interposed in a space between a projection system of the apparatus and a substrate. In this specification, reference will be made in the description to localized immersion in which the immersion liquid is confined, in use, to the space between the projection system and a surface facing the projection system. The facing surface is a surface of substrate or a surface of the supporting stage (or substrate table) that is typically co-planar with the substrate surface. (Please note that any reference in the following text to "surface of the substrate" also refers in addition or in the alternative to a surface of the substrate table, unless expressly stated otherwise; and vice versa.) A fluid handling structure present between the projection system and the stage is used to confine the immersion liquid to the immersion space. The space filled by liquid is typically smaller in plan than the top surface of the substrate and the space remains substantially stationary relative to the projection system while the substrate and substrate stage move underneath.

SUMMARY

In a lithographic apparatus the substrate to be exposed (which may be referred to as a production substrate) is held on a substrate holder (sometimes referred to as a wafer table). The substrate holder may be supported on a substrate table which is moveable with respect to the projection system. The substrate holder usually comprises a solid body made of a rigid material and having similar dimensions in plan to the production substrate to be supported. The substrate-facing surface of the solid body is provided with a plurality of projections (referred to as burls). The distal surfaces of the burls conform to an essentially flat plane and support the substrate. The burls provide several advantages: a contaminant particle on the substrate holder is likely to fall between burls and therefore does not cause a deformation of the substrate; it is easier to machine the burls so their ends conform to a plane than to make the surface of the solid body flat; and the properties of the burls can be adjusted, e.g. to control the clamping of the substrate.

However, the burls of the substrate holder wear during use, e.g. due to the repeated loading and unloading of substrates. Uneven wear of the burls leads to unflatness of the substrate during exposure which can lead to a reduction of the process window and, in extreme cases, to an imaging error. Due to the very precise manufacturing specifications, substrate holders are expensive to manufacture so that it is desirable to increase the working life of a substrate holder.

It is desirable, for example, to provide improved means to reduce wear of substrate holders, especially in an immersion type lithographic apparatus.

According to an aspect, there is provided a lithographic apparatus comprising:
a substrate holder configured to hold a substrate;
a projection system arranged to project an image onto a substrate held by the substrate holder;
a liquid confinement system configured to confine an immersion liquid to a space between the projection system and the substrate; and
a current control device arranged to reduce an electric current flowing between the substrate and the substrate holder while the immersion liquid is confined to the space.

According to an aspect, there is provided a device manufacturing method comprising using a lithographic apparatus having a projection system to project an image onto a substrate held on a substrate holder, the method comprising:
using a liquid confinement to confine a liquid to a space between the projection system and the substrate; and
reducing a current between the liquid confinement system and the substrate holder while the immersion liquid is confined to the space.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

In the present document, the terms "radiation" and "beam" are used to encompass all types of electromagnetic radiation, including ultraviolet radiation (e.g. with a wavelength of 436, 405, 365, 248, 193, 157 or 126 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
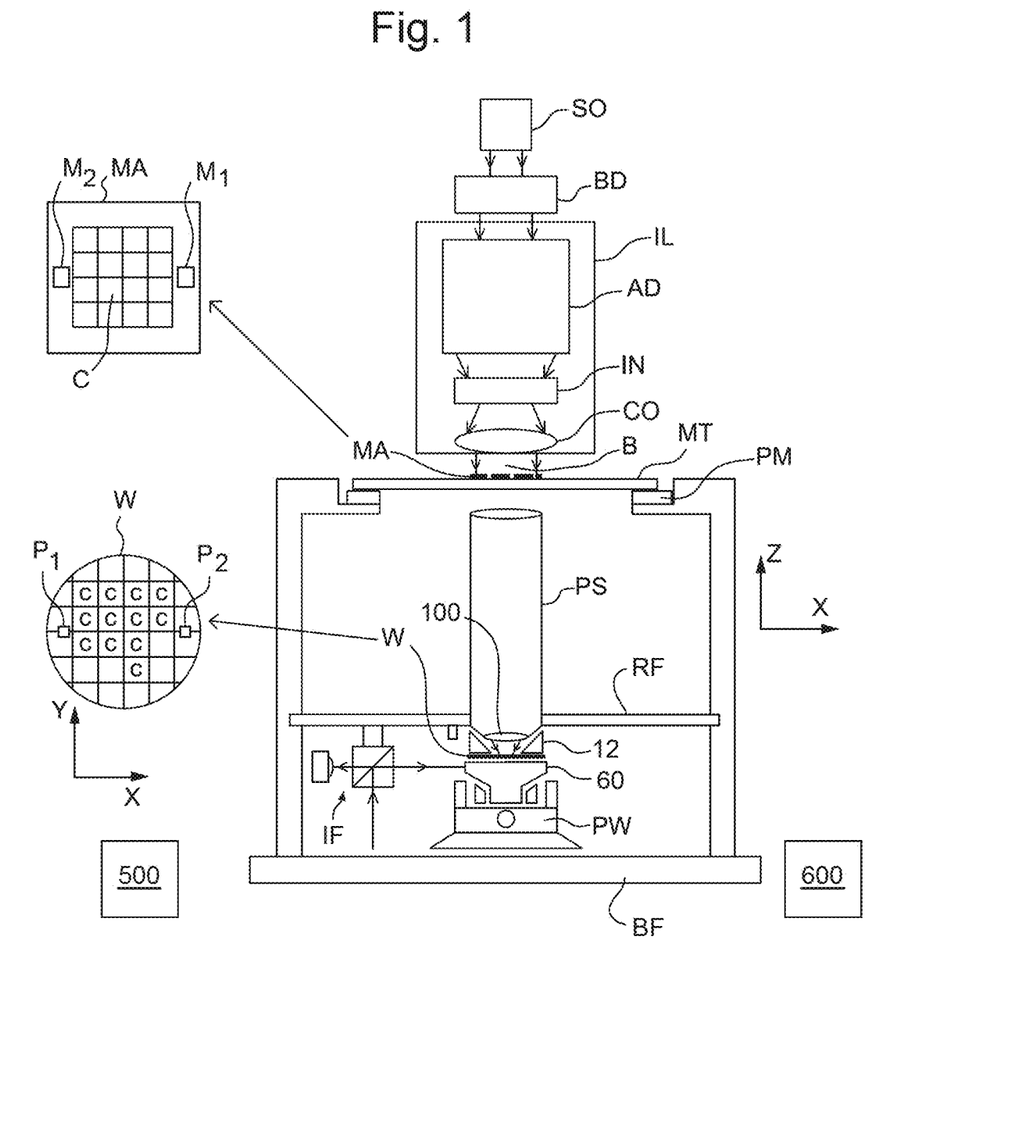
FIG. 1 schematically depicts a lithographic apparatus.

FIG. 1 schematically depicts a lithographic apparatus. The lithographic apparatus includes an illumination system (also referred to as illuminator) IL configured to condition a radiation beam B (e.g., UV radiation or DUV radiation), a mask support (e.g., a mask table) MT constructed to support a patterning device (e.g., a mask) MA and connected to a first positioner PM configured to accurately position the patterning device MA in accordance with certain parameters, a substrate table 60 constructed to hold a substrate (e.g., a resist coated wafer) W and connected to a second positioner PW configured to accurately position the substrate table 60 in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives the radiation beam B from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA. The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus is of a type wherein at least a portion of the substrate W may be covered by an immersion liquid having a relatively high refractive index, e.g., water, so as to fill an immersion space 10 between the projection system PS and the substrate W—which is also referred to as immersion lithography. More information on immersion techniques is given in U.S. Pat. No. 6,952,253, which is incorporated herein in its entirety by reference.

The lithographic apparatus may be of a type having two or more substrate tables 60 (also named "dual stage"). In such "multiple stage" machine, the substrate tables 60 may be used in parallel, and/or steps in preparation of a subsequent exposure of the substrate W may be carried out on the substrate W located on one of the substrate table 60 while another substrate W on the other substrate table 60 is being used for exposing a pattern on the other substrate W.

In addition to the substrate table 60, the lithographic apparatus may comprise a measurement stage (not depicted in FIG. 1). The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate table 60 is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate table 60 can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

In this specification, a Cartesian coordinate system is used. The Cartesian coordinate system has three axis, i.e., an x-axis, a y-axis and a z-axis. Each of the three axis is orthogonal to the other two axis. A rotation around the x-axis is referred to as an Rx-rotation. A rotation around the y-axis is referred to as an Ry-rotation. A rotation around about the z-axis is referred to as an Rz-rotation. The x-axis and the y-axis define a horizontal plane, whereas the z-axis is in a vertical direction. The Cartesian coordinate system is not limiting of the invention and is used for clarification only. Instead, another coordinate system, such as a cylindrical coordinate system, may be used to clarify the invention. The orientation of the Cartesian coordinate system may be different, for example, such that the z-axis has a component along the horizontal plane.

A controller 500 controls the overall operations of the lithographic apparatus and in particular performs an operation process described further below. Controller 500 can be embodied as a suitably-programmed general purpose computer comprising a central processing unit, volatile and non-volatile storage means, one or more input and output devices such as a keyboard and screen, one or more network connections and one or more interfaces to the various parts of the lithographic apparatus. It will be appreciated that a one-to-one relationship between controlling computer and lithographic apparatus is not necessary. One computer can control multiple lithographic apparatuses. Multiple networked computers can be used to control one lithographic apparatus. The controller 500 may also be configured to control one or more associated process devices and substrate handling devices in a lithocell or cluster of which the lithographic apparatus forms a part. The controller 500 can also be configured to be subordinate to a supervisory control system 600 of a lithocell or cluster and/or an overall control system of a fab.

Arrangements for providing liquid between a last optical element 100 of the projection system PS and the substrate W can be classed into three general categories. These are the bath type arrangement, the so-called localized immersion systems and the all-wet immersion systems. Embodiments of the present invention relate particularly, but not exclusively, to localized immersion systems.

In an arrangement which has been proposed for a localized immersion system, a liquid confinement structure 12 extends along at least a part of a boundary of an immersion space 10 between the last optical element 100 of the projection system PS and the facing surface of the stage or table facing the projection system PS. The facing surface of the table is referred to as such because the table is moved during use and is rarely stationary. Generally, the facing surface of the table refers to a surface of a substrate W, substrate table 60 which surrounds the substrate W or both.

Figure 2:
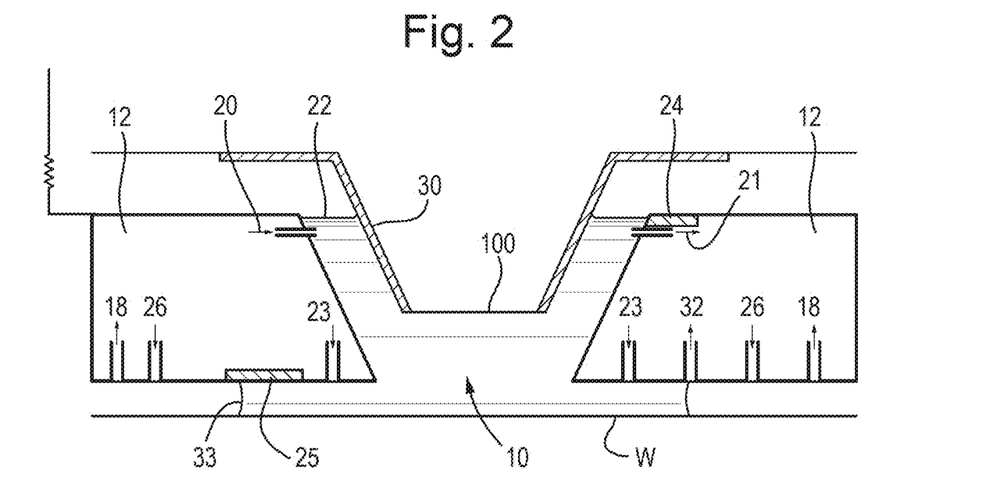
FIG. 2 schematically depicts an immersion liquid confinement structure for use in a lithographic projection apparatus.
Figure 3:
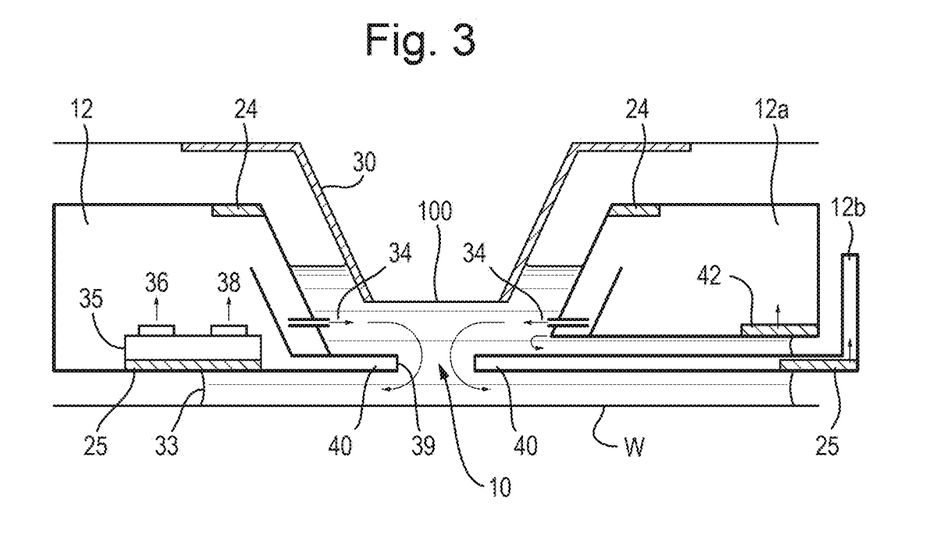
FIG. 3 is a side cross-sectional view that schematically depicts a further immersion confinement structure according to an embodiment.

FIGS. 2 and 3 show different features which may be present in variations of confinement structure 12. The features described herein may be selected individually or in combination as shown or as required.

FIG. 2 shows two variants of a liquid confinement structure 12 around the bottom surface of a last optical (lens) element 100; the left hand side shows one variant and the right hand side another. Features of the two variants may be combined in a single liquid confinement structure. The last optical element 100 has an inverted frustro-conical shape 30. The frustro-conical shape 30 has a planar bottom surface and a conical surface. The frustro-conical shape 30 protrudes from a planar surface and has a bottom planar surface. The bottom planar surface is the optically active portion of the bottom surface of the last optical element 100, through which the projection beam may pass. The liquid confinement structure 12 surrounds at least part of the frustro-conical shape 30. The liquid confinement structure 12 has an inner-surface which faces towards the conical surface of the frustro-conical shape 30. The inner-surface and the conical surface have complementary shape. A top surface of the liquid confinement structure 12 is substantially planar. The liquid confinement structure 12 may fit around the frustro-conical shape 30 of the last optical element 100. A bottom surface of the liquid confinement structure 12 is substantially planar and in use the bottom surface may be parallel with the facing surface of the substrate table 60 and/or the substrate W. The distance between the bottom surface and the facing surface may be in the range of 30 to 500 micrometers, desirably in the range of 80 to 200 micrometers.

The liquid confinement structure 12 extends closer to the facing surface of the substrate W and the substrate table 60 than the last optical element 100. The immersion space 10 is therefore defined between the inner surface of the liquid confinement structure 12, the planar surface of the frustroconical shape 30 and the facing surface. During use, the immersion space 10 is filled with liquid. The liquid fills at least part of a buffer space between the complementary surfaces between the last optical element 100 and the liquid confinement structure 12. In an embodiment, the liquid fills at least part of the immersion space 10 between the complementary inner-surface and the conical surface.

Liquid is supplied to the immersion space 10 through an opening formed in the surface of the liquid confinement structure 12. The liquid may be supplied through a supply opening 20 in the inner-surface of the liquid confinement structure 12. Alternatively or additionally, the liquid is supplied from an under supply opening 23 formed in the undersurface of the liquid confinement structure 12. The under supply opening 23 may surround the path of the projection beam and it may be formed of a series of openings in an array. The liquid is supplied to fill the immersion space 10 so that flow through the immersion space 10 under the projection system PS is laminar. The supply of liquid from the under supply opening 23 under the liquid confinement structure 12 additionally prevents the ingress of bubbles into the immersion space 10. This supply of liquid functions as a liquid seal.

The liquid may be recovered from a recovery opening 21 formed in the inner-surface. The recovery of the liquid through the recovery opening 21 may be by application of an under pressure; the recovery through the recovery opening 21 as a consequence of the velocity of the liquid flow through the immersion space 10; or the recovery may be as a consequence of both. The recovery opening 21 may be located on the opposite side of the supply opening 20, when viewed in plan. Additionally or alternatively, the liquid may be recovered through an overflow opening 24 located on the top surface of the liquid confinement structure 12. Overflow opening 24 prevents the upper surface 22 of the immersion liquid rising too high.

Additionally or alternatively, liquid may be recovered from under the liquid confinement structure 12 through a bottom recovery opening. The bottom recovery opening may serve to hold (or 'pin') a meniscus 33 to the liquid confinement structure 12. The meniscus 33 forms between the liquid confinement structure 12 and the facing surface and it serves as border between the liquid space and the gaseous external environment. The bottom recovery opening may be a porous member 25 or a porous plate which may recover the liquid in a single phase flow. The bottom recovery opening may be a series of pinning openings 32 through which the liquid is recovered. The pinning openings 32 may recover the liquid in a two phase flow.

Optionally radially outward, with respect to the inner-surface of the liquid confinement structure 12, is a gas knife opening 26. Gas may be supplied through the gas knife opening 26 at elevated speed to assist confinement of the immersion liquid in the immersion space 10. The supplied gas may be humidified and it may contain carbon dioxide. The supplied gas may consist essentially of carbon dioxide and water vapor. Radially outward of the gas knife opening 26 is a gas recovery opening 18 for recovering the gas supplied through the gas knife. Further openings, for example open to atmosphere or to a gas source, may be present in the bottom surface of the liquid confinement structure 12. For example, further openings may be present between the gas knife opening 26 and the gas recovery opening 18 and/or between pinning openings 32 and the gas knife opening 26.

Features shown in FIG. 3 which are common to FIG. 2 share the same reference numbers. The liquid confinement structure 12 has an inner surface which complements the conical surface of the frustro-conical shape 30. The undersurface of the liquid confinement structure 12 is closer to the facing surface than the bottom planar surface of the frustro-conical shape 30.

Liquid is supplied to the immersion space 10 through supply openings 34 formed in the inner surface of the confinement structure 12. The supply openings 34 are located towards the bottom of the inner surface, perhaps below the bottom surface of the frustro-conical shape 30. The supply openings 34 are located inner surface, spaced apart around the path of the projection beam.

Liquid is recovered from the immersion space 10 through recovery openings in the undersurface of the liquid confinement structure 12. As the facing surface moves under the liquid confinement structure 12, the meniscus 33 may migrate over the surface of the recovery opening in the same direction as the movement of the facing surface. The recovery openings may be formed of a porous member 25 or a porous plate. The liquid may be recovered in single phase. In an embodiment the liquid may be recovered in a two phase flow. The two phase flow is received in a chamber 35 within the liquid confinement structure 12 where it is separated into liquid and gas. The liquid and gas are recovered through separate channels 36, 38 from the chamber 35.

An inner periphery 39 of the undersurface of liquid confinement structure 12 extends into the immersion space 10 away from the inner surface to form a plate 40. The inner periphery 39 forms a small aperture which may be sized to match the shape and size of the projection beam. The plate 40 may serve to isolate liquid either side of it. The supplied liquid flows inwards towards the aperture, through the inner aperture and then under the plate 40 radially outwardly towards the surrounding recovery openings.

In an embodiment the liquid confinement structure 12 may be in two parts: an inner part 12a and an outer part 12b. For convenience this arrangement is shown in the right-hand part of FIG. 3. The two parts may move relatively to each other, in a plane parallel to the facing surface. The inner part 12a may have the supply openings 34 and it may have the overflow recovery 24. The outer part 12b may have the plate 40 and the recovery opening. The inner part 12a may have an intermediate recovery 42 for recovering liquid which flows between the two parts.

In a lithographic apparatus it is desirable to position the upper surface of a substrate to be exposed in the plane of best focus of the aerial image of the pattern projected by the projection system with great accuracy. To achieve this, the substrate is held on a substrate holder. The surface of the substrate holder that supports the substrate is provided with a plurality of burls whose distal ends are essentially coplanar in a nominal support plane. The burls, though numerous, are small in cross-sectional area parallel to the support plane so that the total cross-sectional area of their distal ends is a few percent, e.g. less than 5%, of the surface area of a substrate. The burls are commonly conical in shape but need not be. In an embodiment, the gas pressure in the space between the substrate holder and the substrate is reduced relative to the pressure above the substrate to create a force clamping the substrate to the substrate holder. In an embodiment, an electrostatic force may be setup to clamp the substrate to the substrate holder.

The burls serve several purposes. For example, if a contaminant particle is present on the substrate holder or the substrate, it is probable that it is not located at the location of the burl and therefore does not distort the substrate. In addition, it is easier to manufacture the burls so that their distal ends conform accurately to an essentially flat plane than to manufacture a large area with very low flatness.

The burls of a substrate holder wear during use. The wear is generally uneven and therefore causes unflatness in the surface of substrates held by a worn substrate holder. When such wear becomes excessive it is necessary to repair or replace the substrate holder. Repair and replacement of the substrate holder are expensive, not only due to the cost of the repair process or the manufacture of a new substrate holder, but also due to the downtime of the lithographic apparatus in order to perform the repair or replacement.

Figure 4:
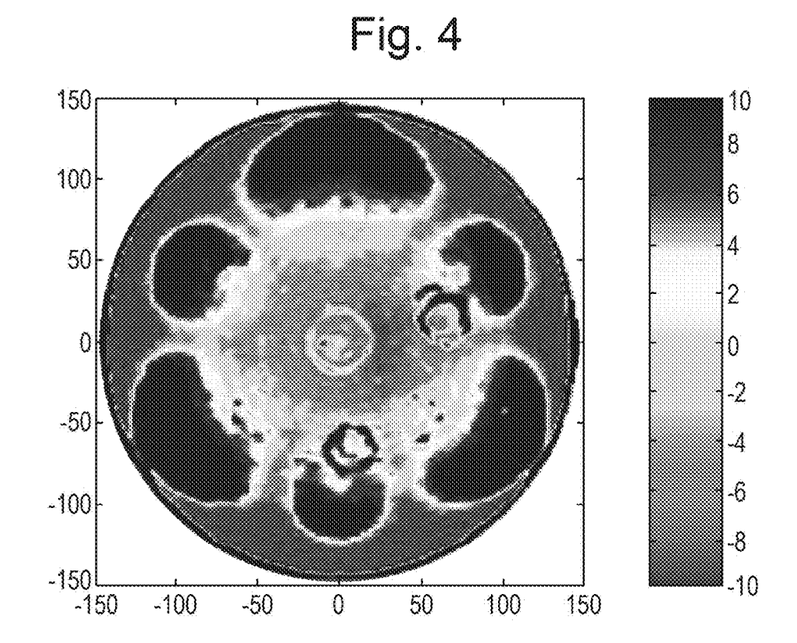
FIG. 4 is a map showing variation in burl height of a used substrate holder.
Figure 5:
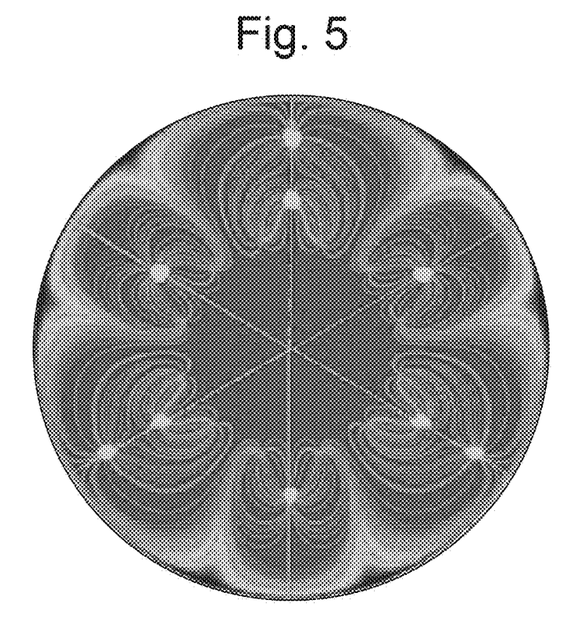
FIG. 5 is a map showing humidity in the space between a substrate holder and the substrate.

It has heretofore been thought that the major cause of wear of burls is the process of loading and unloading substrates onto the substrate holder. However, it has been determined that oxidation of the burls of the substrate holder is also a significant cause of wear of burls, especially in an immersion lithographic apparatus. FIG. 4 depicts a typical pattern of wear in a substrate holder that has been used for exposures in an immersion lithographic apparatus. It will be seen that the pattern of wear of the substrate holder has six petal-like areas distributed around the peripheral region of the substrate holder. The petal-like areas are relatively high compared to the mean height of the burls because areas outside the petal-like areas have been eroded. To investigate possible causes of this pattern of wear, levels of humidity have been simulated in the space between the substrate and the substrate holder during exposures in the immersion lithographic apparatus in which the substrate holder of FIG. 4 was used. The results, shown in FIG. 5, exhibit a petal-like pattern having six petal-like areas arranged similarly to the pattern of wear shown in FIG. 4. The petal-like areas are areas of low humidity and are centered around the evacuation ports of the substrate holder.

Without wishing to be bound by any particular theory, it is believed that a significant amount of wear of the burls is caused by oxidation of the material of the burls (SiSiC) and/or coatings thereon (e.g. of diamond-like carbon) in the areas of relatively high humidity. Herein, the term "oxidation of the substrate holder" is used to refer to oxidation of the burls and/or any coatings thereon that might affect the flatness of a substrate held by the substrate holder. In addition, it is believed that the oxidation can be accelerated by a potential difference between the substrate and the substrate holder, which causes a current to flow between the substrate and substrate holder. A potential difference between the substrate and substrate holder can be caused by tribo-electric effects due to the flow of immersion liquid (e.g. water) across the surface of the substrate. Such a potential difference may depend on the resist used for the photo-sensitive layer and/or any topcoat. A potential difference between the substrate and substrate holder might also be caused by the exposure radiation (e.g. DUV) that is incident on the photo-sensitive layer.

Accordingly therefore, it is proposed to provide, in the immersion lithographic apparatus, a current control device arranged to reduce an electric current flowing between the substrate and the substrate holder while the immersion liquid is confined to the immersion space 10.

Figure 6:
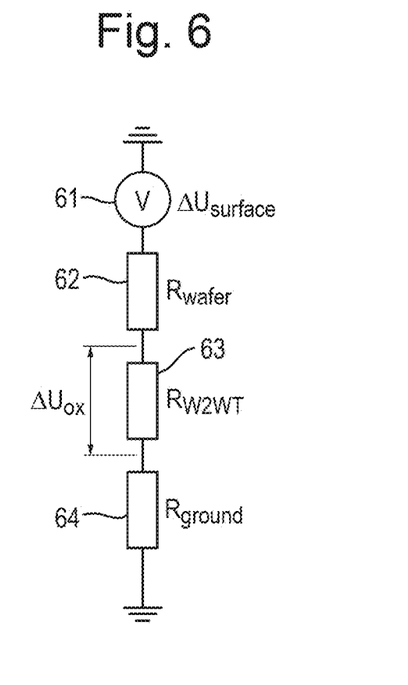
FIG. 6 is a simplified circuit diagram representing the electrical conditions of a substrate during an exposure process in an embodiment of the invention.

In an embodiment, the current control device provides an impedance (e.g. a resistance) of greater than 10 kΩ, or greater than 100 kΩ, desirably greater than 1 MΩ, or greater than 10 MΩ, between the substrate holder and ground. In some circumstances an impedance as high as 100 MΩ may be suitable. Increasing the impedance of the ground path can increase the time taken for the potential of the substrate to equalize when it is loaded onto the substrate table so that the resistance of the ground path should be no higher than necessary. In an embodiment, the impedance of the ground path may be less than about 1 GΩ or less than about 100 MΩ. FIG. 6 shows a simplified electrical circuit of such an embodiment.

The embodiment can be represented by a series circuit comprising: a voltage source 61 representing the potential difference $\Delta U_{surface}$ generated on the substrate surface by, for example, tribo-electric effects and/or irradiation; the resistance 62 of the substrate $R_{wafer}$; the resistance 63 between the substrate and the substrate holder $R_{W2WT}$; and the resistance 64 between the substrate holder and ground $R_{ground}$. The circuit is completed through the ground; the upper surface of the substrate W is connected to ground via the immersion liquid and the liquid confinement system 12.

It is believed that the oxidation of the substrate holder WT is driven, at least in part, by the potential difference $\Delta U_{ox}$ across the resistance 63 between the substrate and the substrate holder $R_{W2WT}$. The resistance 63 between the substrate and the substrate holder $R_{W2WT}$ and the resistance 64 between the substrate holder and ground $R_{ground}$ form a voltage divider that divides the potential difference $\Delta U_{surface}$ generated on the substrate surface. Therefore, by increasing the resistance $R_{ground}$ the potential difference $\Delta U_{ox}$ is reduced, current flow between the substrate holder WT and ground is reduced and hence oxidation of the substrate holder WT is reduced.

Figure 7:
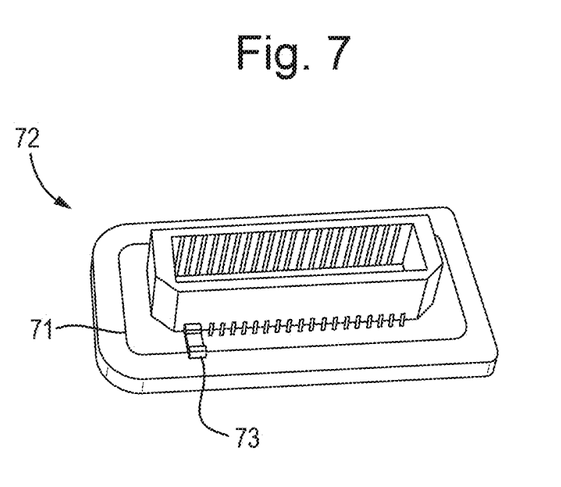
FIG. 7 depicts a connector usable in an embodiment of the invention.

The resistance 64 ($R_{ground}$) can be provided at any convenient point in the electrical path between the substrate holder WT and ground. For example, the substrate holder WT is commonly electrically connected to the substrate table 60. A multi-conductor cable provides power and signal connections to sensors and actuators on the substrate table 60. As shown in FIG. 7, resistor 71 of suitable value can be provided in a connector 72 between a conductor connected to the substrate table 60 and a grounded shield 73.

Figure 8:
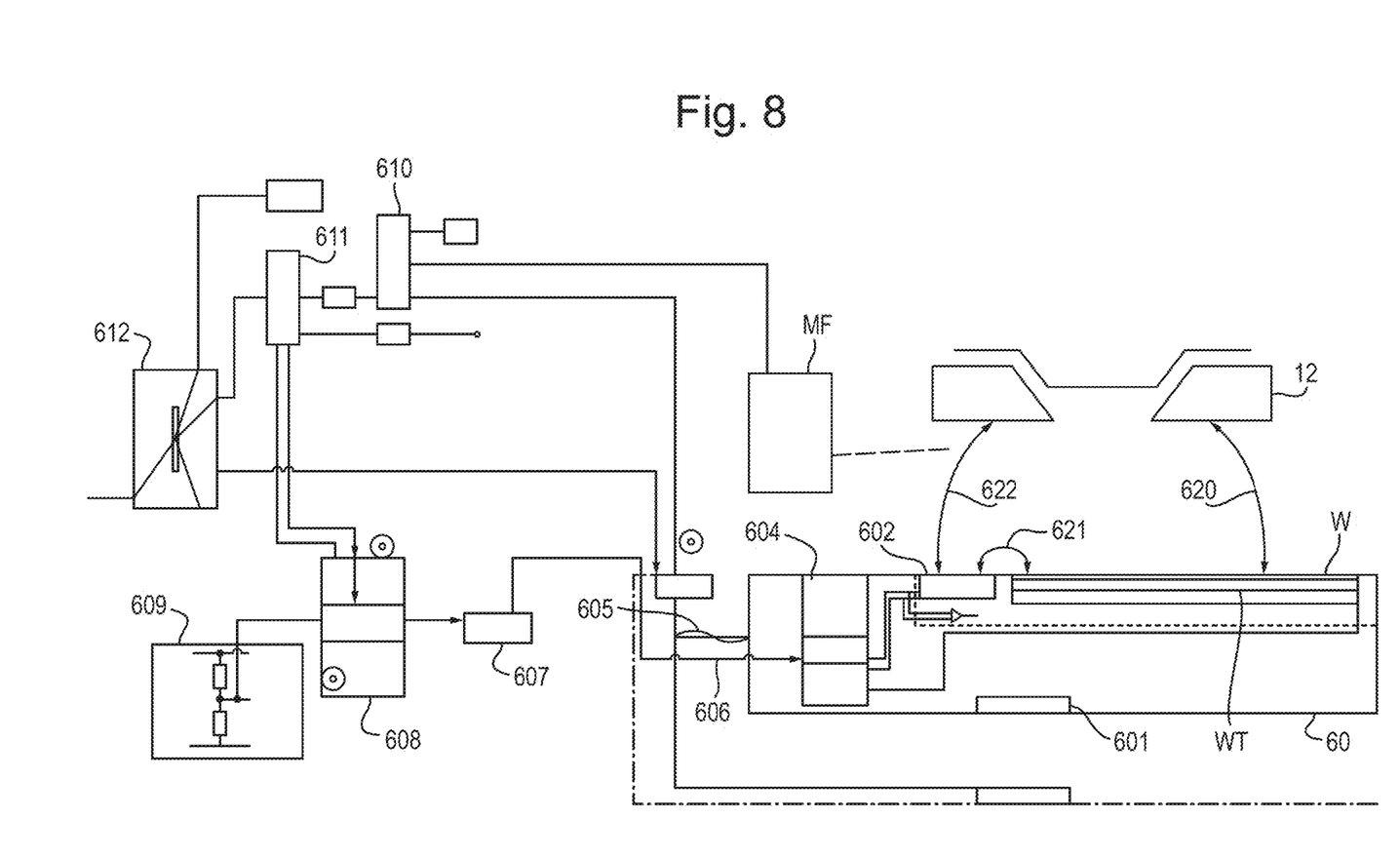
FIG. 8 is a simplified circuit diagram representing the electrical conditions of a substrate during an exposure process in an embodiment of the invention.

It will be appreciated that the lithographic apparatus is considerably more complex than the simplified equivalent circuit depicted in FIG. 6; a more detailed representation is given in FIG. 8.

As shown in FIG. 8, substrate W is held on substrate holder WT, which in turn is mounted in a recess of substrate table 60. Substrate table 60 also comprises one or more actuators 601 and sensors 602 which are electrically connected to an electrical connector box 604. A flexible multi-conductor cable (often referred to as the cable slab 605) provides all necessary electrical connections, for both power and signaling, between the movable substrate table 60 and the static part of the lithographic apparatus. The cable slab 605 includes a ground connection 606, into which an impedance forming the current control device of an embodiment of the present invention can be inserted. Ground connection 606 is connected to the machine ground 609 via various other components such as a power calibrator 607 and current monitor 608. The liquid confinement structure 12 is grounded via the metrology frame MF, and other components such as power lockout 610, circuit breaker 611 and power distribution cabinet 612. At certain times during exposure of substrates or measurement processes, it is possible that immersion liquid is simultaneously in contact with the substrate W and sensor 602. During such times, in addition to the current 620 between substrate W and liquid confinement structure 12, a substrate-sensor current 621 may arise between the substrate W and the sensor 602 and a sensor-structure current 622 may arise between the sensor 602 and the liquid confinement structure 12. If the magnitudes of the substrate-sensor current 621 and the sensor-structure current 622 are significant, they may be taken account of in determining a suitable value for the impedance 64 forming the current control device.

It will be noted that cooling water used to cool various parts of the lithographic apparatus has potential to provide a parallel path to ground. If the path to ground through such cooling water has a resistance lower than that of the current control device, then the effectiveness of a passive current control device might be reduced. This circumstance can be avoided by maintaining the purity of the cooling water high, and hence its conductivity low. In the event that the conductivity of the cooling water increases sufficiently to affect the effectiveness of the current control device it can be refreshed with purer water. If an active current control device is used then the conductivity of the cooling water may not be important.

Figure 9:
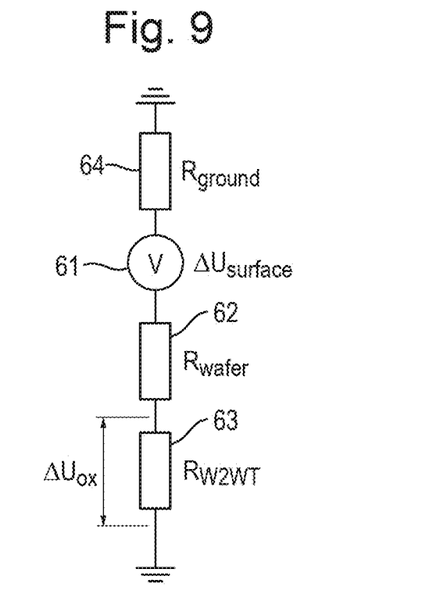
FIG. 9 is a more detailed circuit diagram representing the electrical conditions of a substrate during an exposure process in an embodiment of the invention.

In an embodiment, the current control device provides an impedance (e.g. a resistance) of greater than 10 kΩ, or greater than 100 kΩ, desirably 1 MΩ, or greater than 10 MΩ, between the liquid confinement structure 12 and ground. FIG. 9 shows a simplified electrical circuit of such an embodiment. In this Figure, components that are equivalent to those of FIG. 6 are indicated by the same references and not described again for the sake of brevity. Impedance 64 is located in the electrical path from the liquid confinement structure 12 to ground but functions to limit the current flowing between the substrate W and substrate holder WT in just the same way as in the embodiment of FIG. 6.

In the above described embodiments, the impedance 64 forming the current control device may be a variable impedance. Such a variable impedance may be controlled on the basis of a measurement of the current flowing to ground and/or the potential of the substrate W.

Figure 10:
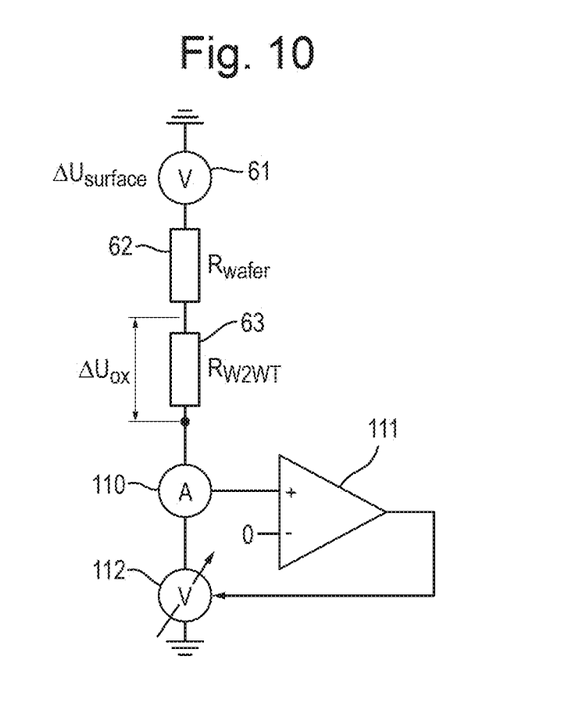
FIG. 10 is a simplified circuit diagram representing the electrical conditions of a substrate during an exposure process in an embodiment of the invention.

A further embodiment is shown in FIG. 10, in which parts that are equivalent to parts of earlier embodiments are given the same references and not described again in the interest of brevity. In this embodiment, the current control device comprises a current sensor 110, a controller 111 (e.g. an operational amplifier) and a variable voltage source 112. The current sensor 110 is arranged in the electrical path between the substrate holder WT and ground and measures the current flowing therein. The controller 111 receives the output of the current sensor 110 and generates a control signal proportional thereto. The variable voltage source 112 is arranged in the electrical path between the current sensor 110 and ground, receives the control signal and sets its output voltage accordingly. Thus the current sensor 110, controller 111 and variable voltage source 112 are configured as a feedback loop to reduce the current flowing to ground and hence the current flowing between the substrate W and substrate holder WT.

Figure 11:
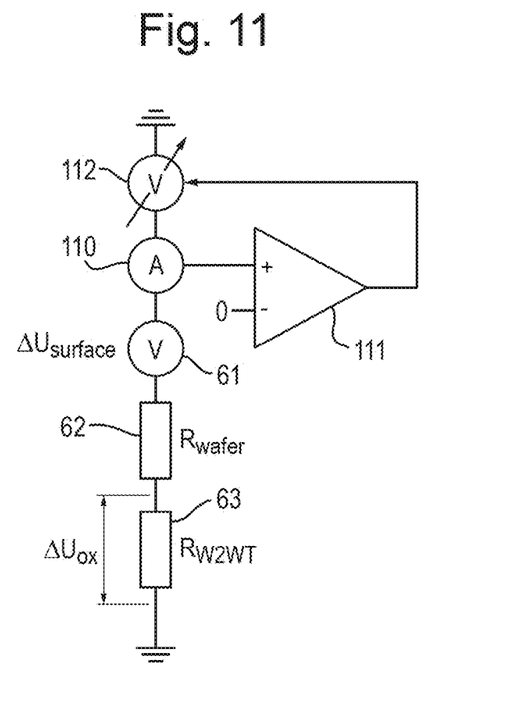
FIG. 11 is a simplified circuit diagram representing the electrical conditions of a substrate during an exposure process in an embodiment of the invention.

FIG. 11 depicts a variant of the embodiment of FIG. 10. In the embodiment of FIG. 11, the current control device, again comprising current sensor 110, controller 111 and variable voltage source 112, is arranged in the electrical path between the liquid confinement system 12 and ground rather than between the substrate table 60 and ground. Nevertheless, the current control device of FIG. 11 functions in the same way as that of FIG. 10.

In further variants (not shown in the figures), the current flowing from substrate table 60 to ground can be measured and used to control a voltage applied to the liquid confinement system 12 or the current flow to ground from the liquid confinement system 12 can be measured and used to control a voltage applied to the substrate holder WT.

In the embodiments of FIGS. 10 and 11, the variable voltage source may be replaced by a different electrical power source, such as a current source. Alternatively or in addition, the current sensor 110 can be replaced by a voltage sensor. A voltage sensor may be arranged to measure the potential of the substrate W or the substrate holder WT. For example an electrostatic voltage meter can be located in the liquid confinement structure 12 to measure the potential of the top of the substrate W or in the substrate holder WT to measure the potential of the bottom of the substrate W.

Figure 12:
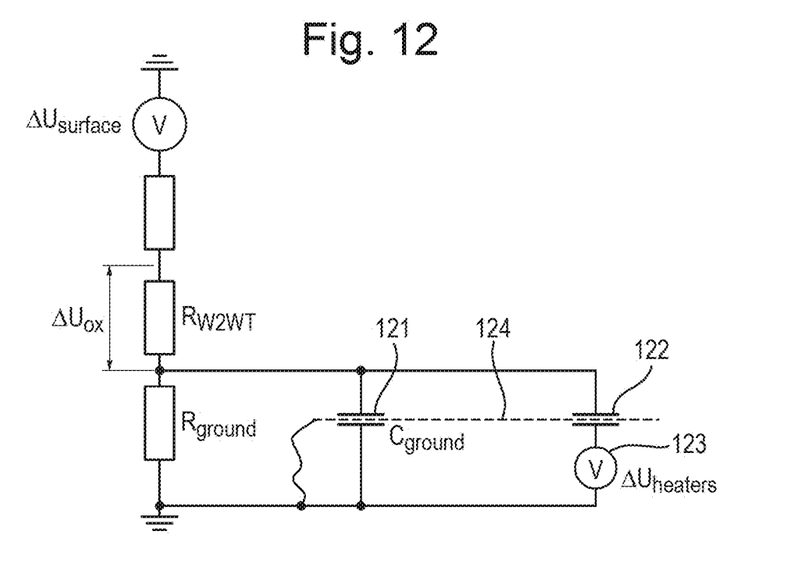
FIG. 12 is a simplified circuit diagram representing the electrical conditions of a substrate during an exposure process in an embodiment of the invention.

An immersion-type lithographic apparatus may be provided with one or more substrate table heaters in the substrate holder WT to counteract the cooling effect of evaporation of the immersion liquid and assist in maintaining the substrate holder WT and substrate W at a constant temperature. Although such a substrate table heater may be electrically insulated from the substrate holder WT and the path to ground, the heaters may be capacitively linked to the ground path. This is depicted in FIG. 12, which is a simplified electrical equivalent circuit diagram of an embodiment including substrate table heaters, by capacitors 121 and 122. Voltage source 123 represents the potential difference $\Delta U_{heaters}$ induced by the currents flowing in the substrate table heaters, which may be AC or include a variable component.

To reduce the effect of currents flowing in the substrate table heaters, a conductive shield 124 is provided between the substrate table heaters and the ground path from the substrate holder WT and is electrically connected to ground. The conductive shield 124 may form a Faraday cage enclosing the substrate table heaters. The conductive shield 124 can be formed by a conductive foil or mesh wrapped around the substrate table heaters. Alternatively or in addition, the conductive shield 124 may comprise a conductive glue used to secure the substrate table heaters in place.

Embodiments are provided according to the following clauses:

1. A substrate table for an immersion system comprising a projection system arranged to project an image onto a substrate and a liquid confinement system configured to confine an immersion liquid to a space between the projection system and the substrate, the substrate table comprising:
    a substrate holder configured to hold the substrate; and
    a current control device arranged to reduce an electric current flowing between the substrate and the substrate holder whilst the immersion liquid is confined to the space.
2. The substrate table according to clause 1, wherein the current control device provides an impedance of greater than 100 kΩ, desirably greater than 10 MΩ, between the substrate holder and ground and/or between the liquid confinement system and ground.
3. The substrate table according to clause 2, wherein the impedance is variable and the current control device further comprises a controller to control the impedance.
4. The substrate table according to clause 1, wherein the current control device comprises an electrical power source connected to at least one of the substrate holder, the substrate table and the liquid confinement system.
5. The substrate table according to clause 3, wherein the current control device further comprises:
    a current detector to detect a current between the substrate holder and ground and/or between the liquid confinement system and ground; and
    a controller to control the electrical power source and/or the impedance on the basis of the detection of current.
6. The substrate table according to clause 3, wherein the current control device further comprises:
    a voltage sensor to measure a potential of a part of the substrate, the substrate holder and/or the liquid confinement system; and
    a controller to control the electrical power source and/or the impedance on the basis of the measured potential.
7. The substrate table according to clause 6, wherein the voltage sensor is arranged to measure a potential of the lower surface of the substrate; and the electrical power source is connected to the substrate holder or the substrate table.
8. The substrate table according to clause 6, wherein the voltage sensor is arranged to measure a potential of the upper surface of the substrate; and the electrical power source is connected to the liquid confinement system.
9. The substrate table according to any of clauses 1-8, further comprising an electrical heater configured to heat at least a part of the substrate and wherein the current control device comprises a grounded shield arranged between the electrical heater and the substrate holder.
10. The substrate table according to any of clauses 1-8, wherein the current control device comprises a conductor configured to contact the substrate to provide a direct electrical path between the substrate and ground.
11. The substrate table, according to clause 10, wherein the conductor comprises a burl having a hard conductive coating without an insulating outer layer.
12. The substrate table according to clause 11, wherein the hard conductive coating is made from at least one material selected from the group consisting of CrN, TiN, doped DLC, and alloys containing one or more of Ti, W and Mo.
13. The substrate table according to clause 10, wherein the conductor comprises an actuated pin configured to lift the substrate from the substrate holder.
14. A lithographic apparatus comprising:
    a substrate holder configured to hold a substrate;
    a projection system arranged to project an image onto a substrate held by the substrate holder;
    a liquid confinement system configured to confine an immersion liquid to a space between the projection system and the substrate; and
    a current control device arranged to reduce an electric current flowing between the substrate and the substrate holder whilst the immersion liquid is confined to the space.
15. The lithographic apparatus according to clause 14 wherein the current control device provides an impedance of greater than 10 kΩ, desirably greater than 1 MΩ, between the substrate holder and ground and/or between the liquid confinement system and ground.
16. The lithographic apparatus according to clause 15, wherein the impedance is variable and the current control device further comprises a controller to control the impedance.
17. The lithographic apparatus according to clause 14 or clause 15, wherein the current control device comprises an electrical power source connected to at least one of the substrate holder, the substrate table and the liquid confinement system.

18. The lithographic apparatus according to clause 16 or clause 17, wherein the current control device further comprises:
   a current detector to detect a current between the substrate holder and ground and/or between the liquid confinement system and ground; and
   a controller to control the electrical power source and/or the impedance on the basis of the detection of current.
19. The lithographic apparatus according to clause 16 or clause 17, wherein the current control device further comprises:
   a voltage sensor to measure a potential of a part of the substrate, the substrate holder and/or the liquid confinement system; and
   a controller to control the electrical power source and/or the impedance on the basis of the measured potential.
20. The lithographic apparatus according to clause 19, wherein the voltage sensor is arranged to measure a potential of the lower surface of the substrate; and the electrical power source is connected to the substrate holder or the substrate table.
21. The lithographic apparatus according to clause 19, wherein the voltage sensor is arranged to measure a potential of the upper surface of the substrate; and the electrical power source is connected to the liquid confinement system.
22. The lithographic apparatus according to any of clauses 14-21, further comprising an electrical heater configured to heat at least a part of the substrate and wherein the current control device comprises a grounded shield arranged between the electrical heater and the substrate holder.
23. The lithographic apparatus according to any of clauses 14-22, wherein the current control device comprises a conductor configured to contact the substrate to provide a direct electrical path between the substrate and ground.
24. The lithographic apparatus according to clause 23, wherein the conductor comprises a burl having a hard conductive coating without an insulating outer layer.
25. The lithographic apparatus according to clause 24, wherein the hard conductive coating is made from at least one material selected from the group consisting of CrN, TiN, doped DLC, and alloys containing one or more of Ti, W and Mo.
26. The lithographic apparatus according to clause 23, wherein the conductor comprises an actuated pin configured to lift the substrate from the substrate holder.
27. A device manufacturing method comprising using a lithographic apparatus having a projection system to project an image onto a substrate held on a substrate holder, the method comprising:
   using a liquid confinement to confine a liquid to a space between the projection system and the substrate; and
   reducing a current between the liquid confinement system and the substrate holder while the immersion liquid is confined to the space.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains one or multiple processed layers.

Although specific reference may have been made above to the use of embodiments of the invention in the context of optical lithography, it will be appreciated that embodiments of the invention may be used in other applications.

While specific embodiments of the invention have been described above, it will be appreciated that embodiments of the invention may be practiced otherwise than as described.

The descriptions above are intended to be illustrative, not limiting. Thus, it will be apparent to one skilled in the art that modifications may be made to the invention as described without departing from the scope of the claims set out below.

The invention claimed is:

1. A liquid confinement system for an immersion system having a projection system arranged to project an image onto a substrate, the liquid confinement system configured to confine an immersion liquid to a space between the projection system and the substrate, the liquid confinement system comprising a current control device configured to reduce an electric current flowing between a surface of the substrate and the liquid confinement system while immersion liquid is confined to the space.

2. The liquid confinement system according to claim 1, wherein the current control device is configured to provide an impedance of greater than 10 kΩ between the liquid confinement system and ground.

3. The liquid confinement system according to claim 2, wherein the impedance is greater than 1 MΩ.

4. The liquid confinement system according to claim 2, wherein the impedance is variable and the current control device further comprises a controller to control the impedance.

5. The liquid confinement system according to claim 2, wherein the current control device further comprises:
   a current detector to detect a current between the liquid confinement system and ground; and
   a controller to control the impedance based on the detection of current.

6. The liquid confinement system according to claim 2, wherein the current control device further comprises:
   a voltage sensor to measure a potential of a part of the liquid confinement system and/or of the substrate; and
   a controller to control the impedance based on the measured potential.

7. The liquid confinement system according to claim 1, wherein the current control device comprises an electrical power source connected to the liquid confinement system.

8. The liquid confinement system according to claim 7, wherein the current control device further comprises:
   a current detector to detect a current between the liquid confinement system and ground; and
   a controller to control the electrical power source based on the detection of current.

9. The liquid confinement system according to claim 7, wherein the current control device further comprises:
   a voltage sensor to measure a potential of a part of the liquid confinement system and/or of the substrate; and
   a controller to control the electrical power source based on the measured potential.

10. The liquid confinement system according to claim 7, wherein a voltage sensor is arranged to measure a potential of an upper surface of the substrate.

11. A lithographic apparatus comprising:
a projection system arranged to project an image onto a substrate held by a substrate holder; and
the liquid confinement system according to claim 1 configured to confine an immersion liquid to a space between the projection system and the substrate.

12. A device manufacturing method comprising using a lithographic apparatus having a projection system to project an image onto a substrate, the method comprising:
using a liquid confinement system to confine a liquid to a space between the projection system and the substrate; and
reducing an electric current flowing between a surface of the substrate and the liquid confinement system while immersion liquid is confined to the space.

13. The method according to claim 12, wherein the reducing the electric current comprises providing an impedance of greater than 10 kΩ between the liquid confinement system and ground.

14. The method according to claim 13, wherein the impedance is greater than 1 MΩ.

15. The method according to claim 13, further comprising varying the impedance using a controller.

16. The method according to claim 12, wherein the reducing the electric current comprises:
detecting a current between the liquid confinement system and ground; and
controlling an electrical power source and/or an impedance on the basis of the detection of current.

17. The method according to claim 12, wherein the reducing the electric current comprises:
measuring a potential of a part of the substrate and/or the liquid confinement system; and
controlling an electrical power source and/or an impedance on the basis of the measured potential.

18. The method according to claim 12, wherein the reducing the electric current comprises using an electrical power source connected to the liquid confinement system.

19. The method of claim 12, further comprising measuring a potential of an upper surface of the substrate using a voltage sensor.

* * * * *